(12) United States Patent
Migita et al.

(10) Patent No.: US 10,720,410 B2
(45) Date of Patent: Jul. 21, 2020

(54) SEMICONDUCTOR DEVICE AND MANUFACTURING METHOD THEREOF

(71) Applicant: TOSHIBA MEMORY CORPORATION, Tokyo (JP)

(72) Inventors: Tatsuo Migita, Nagoya Aichi (JP); Koji Ogiso, Oita Oita (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 40 days.

(21) Appl. No.: 16/125,171

(22) Filed: Sep. 7, 2018

(65) Prior Publication Data

US 2019/0006324 A1    Jan. 3, 2019

Related U.S. Application Data

(63) Continuation of application No. 15/060,045, filed on Mar. 3, 2016, now Pat. No. 10,115,703.

(30) Foreign Application Priority Data

Mar. 17, 2015   (JP) .................................. 2015-053864
May 29, 2015    (JP) .................................. 2015-110513

(51) Int. Cl.
*H01L 25/065*   (2006.01)
*H01L 23/00*    (2006.01)

(52) U.S. Cl.
CPC .......... *H01L 25/0657* (2013.01); *H01L 24/05* (2013.01); *H01L 24/13* (2013.01);
(Continued)

(58) Field of Classification Search
None
See application file for complete search history.

(56) References Cited

U.S. PATENT DOCUMENTS 6,424,049 B1    7/2002   Sameshima
7,560,814 B2    7/2009   Yuzawa et al.
(Continued)

FOREIGN PATENT DOCUMENTS

CN    103426849 A    12/2013
JP    2000-269271 A    9/2000
(Continued)

OTHER PUBLICATIONS

Taiwan Office Action dated Feb. 24, 2017, flied in Taiwan counterpart. Application No. 104139212, 10 pages (with translation).
(Continued)

*Primary Examiner* — Thien F Tran
(74) *Attorney, Agent, or Firm* — Kim & Stewart LLP

(57) ABSTRACT

A semiconductor device includes a first semiconductor substrate, a second semiconductor substrate, a first metal layer located on the first semiconductor substrate, a second metal layer located on the second semiconductor substrate, a third metal layer, a first alloy layer, and a second alloy layer. The third metal layer extends between the first metal layer and the second metal layer. The first alloy layer comprises components of the first and third metal layers, and is provided between the first metal layer and the third metal layer. The second alloy layer comprises components of the second and third metal layers, and is provided between the second metal layer and the third metal layer. At least one of the first metal the second metal layers projects into the third metal layer at a circumferential edge portion thereof.

18 Claims, 7 Drawing Sheets

(52) U.S. Cl.
CPC ............. *H01L 24/16* (2013.01); *H01L 24/17* (2013.01); *H01L 24/02* (2013.01); *H01L 24/81* (2013.01); *H01L 2224/023* (2013.01); *H01L 2224/0401* (2013.01); *H01L 2224/05009* (2013.01); *H01L 2224/0557* (2013.01); *H01L 2224/05073* (2013.01); *H01L 2224/05144* (2013.01); *H01L 2224/05548* (2013.01); *H01L 2224/05559* (2013.01); *H01L 2224/05644* (2013.01); *H01L 2224/05655* (2013.01); *H01L 2224/10126* (2013.01); *H01L 2224/131* (2013.01); *H01L 2224/13009* (2013.01); *H01L 2224/13017* (2013.01); *H01L 2224/13019* (2013.01); *H01L 2224/13022* (2013.01); *H01L 2224/13024* (2013.01); *H01L 2224/13082* (2013.01); *H01L 2224/13111* (2013.01); *H01L 2224/13116* (2013.01); *H01L 2224/13144* (2013.01); *H01L 2224/13155* (2013.01); *H01L 2224/13565* (2013.01); *H01L 2224/13655* (2013.01); *H01L 2224/1601* (2013.01); *H01L 2224/16058* (2013.01); *H01L 2224/16145* (2013.01); *H01L 2224/16146* (2013.01); *H01L 2224/16148* (2013.01); *H01L 2224/16227* (2013.01); *H01L 2224/16503* (2013.01); *H01L 2224/1703* (2013.01); *H01L 2224/17106* (2013.01); *H01L 2224/17181* (2013.01); *H01L 2224/8121* (2013.01); *H01L 2224/81191* (2013.01); *H01L 2224/81193* (2013.01); *H01L 2224/81815* (2013.01); *H01L 2924/00012* (2013.01); *H01L 2924/01028* (2013.01); *H01L 2924/01047* (2013.01); *H01L 2924/01079* (2013.01); *H01L 2924/01322* (2013.01); *H01L 2924/15311* (2013.01); *H01L 2924/3512* (2013.01)

(56) References Cited

U.S. PATENT DOCUMENTS

| | | | |
|---|---|---|---|
| 7,728,431 | B2 | 6/2010 | Harada et al. |
| 8,319,350 | B2 | 11/2012 | Katsurayama et al. |
| 8,610,269 | B2 | 12/2013 | Nanba |
| 8,803,317 | B2 | 8/2014 | Arvin et al. |
| 8,846,520 | B2 | 9/2014 | Matsuda |
| 2002/0093096 | A1 | 7/2002 | Tago et al. |
| 2008/0111213 | A1 | 5/2008 | Akram et al. |
| 2012/0091577 | A1 | 4/2012 | Hwang et al. |
| 2013/0134581 | A1* | 5/2013 | Lin .............. H01L 21/563 257/737 |
| 2013/0134582 | A1 | 5/2013 | Yu et al. |
| 2013/0307144 | A1 | 11/2013 | Yu et al. |
| 2014/0264841 | A1 | 9/2014 | Lin et al. |

FOREIGN PATENT DOCUMENTS

| | | |
|---|---|---|
| JP | 2005-268397 A | 9/2005 |
| JP | 2010-087147 A | 4/2010 |
| JP | 2012-204444 A | 10/2012 |
| JP | 2013-021058 A | 1/2013 |
| JP | 2014-192383 A | 10/2014 |
| TW | 201128751 A | 8/2011 |
| TW | 201227891 A | 7/2012 |
| WO | 2008054012 A1 | 5/2008 |
| WO | 2010150912 A1 | 12/2010 |

OTHER PUBLICATIONS

Chinese First Office Action dated Feb. 5, 2018 filed in counterpart Chinese Patent Application No. 2015108491203 (13 pages) (with translation).

Notice of Reasons for Refusal dated Apr. 24, 2018 in corresponding Japanese Patent Application No. 2015-110513 With English translation, 11 pages.

* cited by examiner

| DEPTH d3 | 4.3 μm | 4.2 μm | ... | 4.0 μm | ... | 3.5 μm |
|---|---|---|---|---|---|---|
| VOID | × | × | ... | △ | ... | ○ |

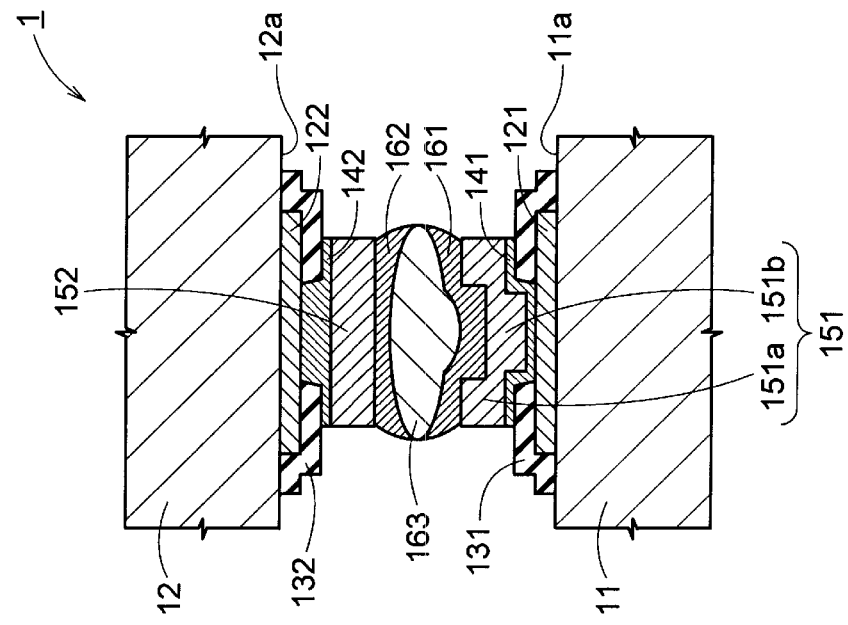
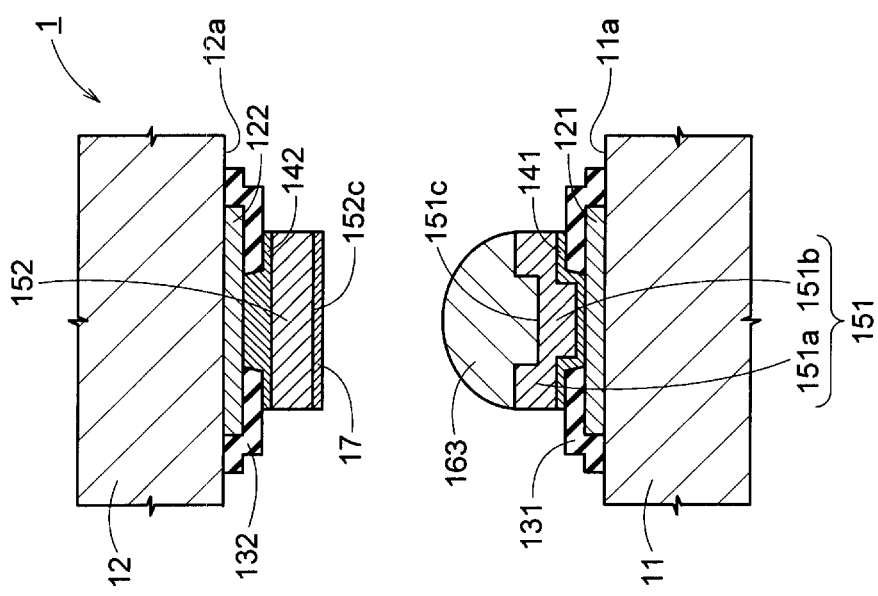

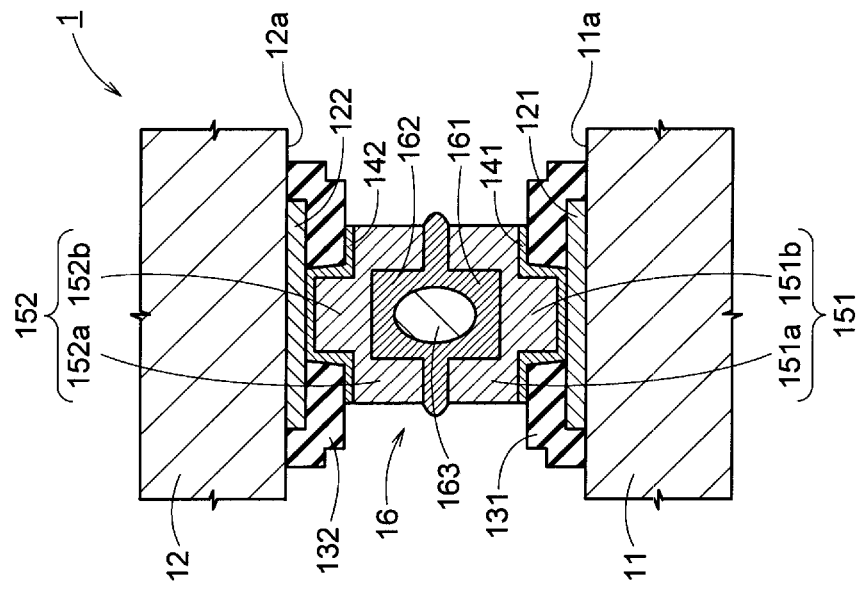
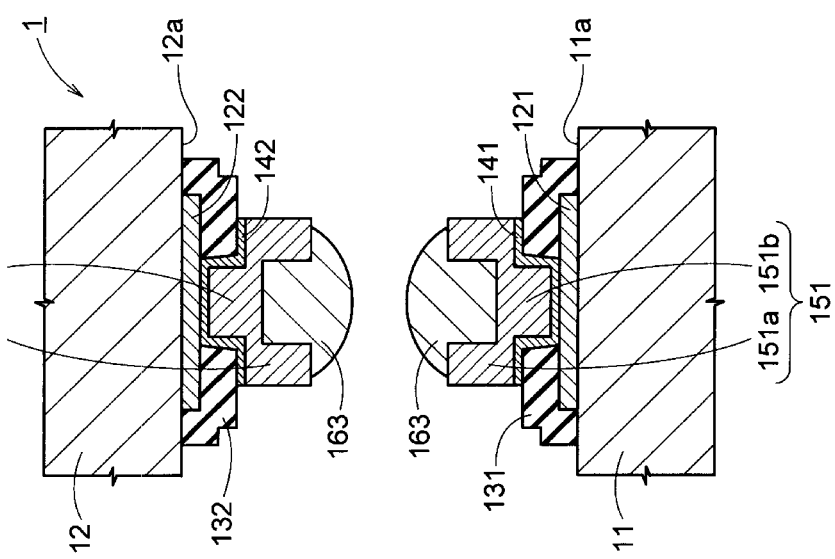

SEMICONDUCTOR DEVICE AND MANUFACTURING METHOD THEREOF

CROSS-REFERENCE TO RELATED APPLICATION

This application is a continuation of U.S. patent application Ser. No. 15/060,045, filed Mar. 3, 2016, which application is based upon and claims the benefit of priority from Japanese Patent Application No. 2015-110513, filed May 29, 2015, and Japanese Patent Application No 2015-053864, filed Mar. 17, 2015, the entire contents of each of which are incorporated herein by reference.

FIELD

Embodiments described herein relate generally to a semiconductor device and a manufacturing method thereof.

BACKGROUND

In recent years, 3-dimensional and 2.5-dimensional stacked semiconductor devices incorporating a plurality of interconnected semiconductor substrates (chips) stacked therein has gained attention in terms of higher performance of the semiconductor device. In manufacturing of the stacked semiconductor device, in order to connect the densely spaced fine wirings of the substrates with each other, the semiconductor substrates are bonded to each other using a micro-bump configured with a solder layer and a barrier layer.

When the number of stacked layers of the semiconductor substrates is increased, the thickness of the stacked semiconductor device (package) is increased. In order to reduce the thickness of the stacked semiconductor device, it is necessary to reduce the distance between the adjacent semiconductor substrates. In order to reduce the distance between semiconductor substrates, in the related art, the amount of solder used to interconnect the adjacent substrates is reduced. However, when the amount of solder is excessively small, the solder alloys with the barrier layer, such that it is difficult to maintain un-alloyed solder required for bonding together the wirings of the semiconductor substrates.

Therefore, in the stacked semiconductor device, there is a need to reduce the thickness of the semiconductor device and to appropriately bond semiconductor substrates (chips) with each other.

DESCRIPTION OF THE DRAWINGS

FIGS. 4A and 4B illustrate a manufacturing method of the semiconductor device according to a first modification example of the first embodiment.

FIGS. 5A and 5B illustrate a manufacturing method of the semiconductor device according to a second modification example of the first embodiment.

DETAILED DESCRIPTION

Provided are a semiconductor device and a manufacturing method thereof which are capable of reducing the thickness of the semiconductor device and appropriately bonding semiconductor substrates.

In general, according to one embodiment, a semiconductor device includes a first semiconductor substrate, a second semiconductor substrate, a first metal layer, a second metal layer, a third metal layer, a first alloy layer, and a second alloy layer. The first semiconductor substrate and the second semiconductor substrate face each other. The first metal layer is provided on the first semiconductor substrate, and faces the second semiconductor substrate. The second metal layer is provided on the second semiconductor substrate, and faces the first metal layer. The third metal layer is provided between the first metal layer and the second metal layer. The first alloy layer is provided between the first metal layer and the third metal layer, and contains a component of the first metal layer and a component of the third metal layer. The second alloy layer is provided between the second metal layer and the third metal layer, and contains a component of the second metal layer and a component of the third metal layer. At least one of the first metal layer and the second metal layer project into the third metal layer in a circumferential edge portion thereof.

Hereinafter, embodiments will be described with reference to the drawings. The embodiments do not limit the present invention.

First Embodiment

Figures 1, 2:
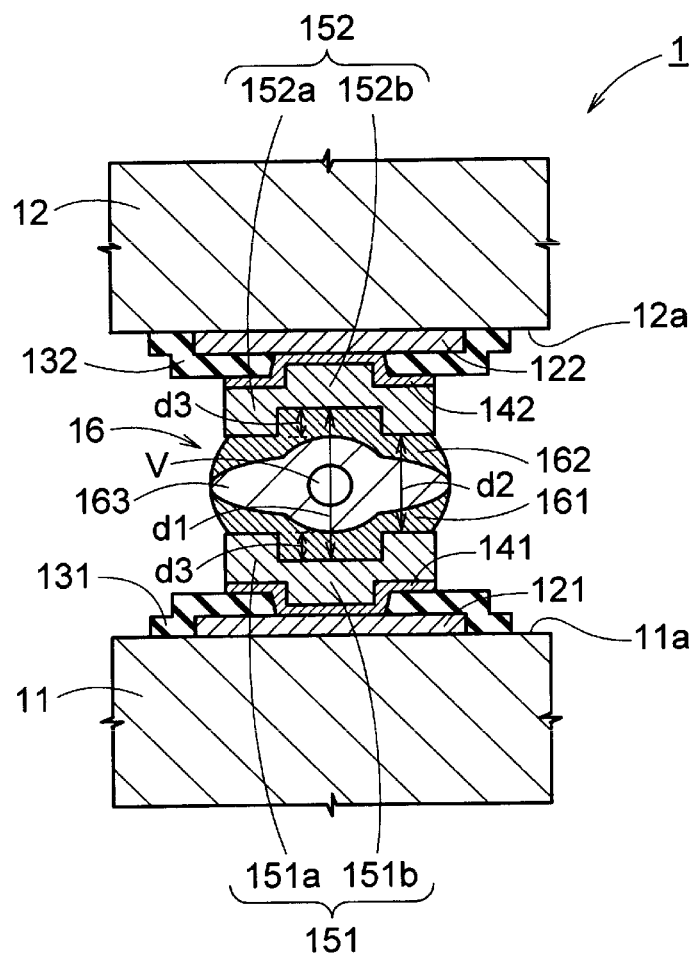
FIG. 1 is a schematic sectional view illustrating a semiconductor device according to a first embodiment.
FIG. 2 is a diagram illustrating voids occurring in a solder layer depending on the depth of a recess in a central portion of a barrier layer according to the first embodiment.

FIG. 1 is a schematic sectional view of a semiconductor device 1 according to a first embodiment. As illustrated in FIG. 1, the semiconductor device 1 includes a first semiconductor substrate 11 and a second semiconductor substrate 12 facing each other.

Further, the semiconductor device 1 includes a first pad electrode 121, a first passivation layer 131 which is an insulating layer, a first base metal layer 141, and a first barrier layer 151 which is a first metal layer, located in that order on the surface 11a (an upper surface in FIG. 1) of the first semiconductor substrate 11. The first barrier layer 151 is provided on the first base metal layer 141 located on the first passivation layer 131 on the first semiconductor substrate 11, and faces the second semiconductor substrate 12.

Further, the semiconductor device 1 includes a second pad electrode 122, a second passivation layer 132, a second base metal layer 142, and a second barrier layer 152 comprising a second metal layer located in that order on the surface 12a (a lower surface in FIG. 1) of the second semiconductor substrate 12. The second barrier layer 152 is provided on the second base metal layer 142 of the second semiconductor substrate 12, and faces the first barrier layer 151.

Further, the semiconductor device 1 includes a bonding layer 16 (junction portion) between the first barrier layer 151 and the second barrier layer 152. The bonding layer 16 includes a first alloy layer 161, a solder layer 163 which is a third metal layer, and a second alloy layer 162 in that order in the direction extending away from the first barrier layer 151. In other words, the solder layer 163 is located between the first barrier layer 151 and the second barrier layer 152. The first alloy layer 161 is located between the first barrier layer 151 and the solder layer 163. The second alloy layer 162 is located between the second barrier layer 152 and the solder layer 163.

The first pad electrode 121 is located on the surface 11a of the first semiconductor substrate 11. The first pad electrode 121 is electrically connected to devices and wirings, not illustrated, which are formed on or in the first semiconductor substrate 11. Similarly, the second pad electrode 122 is located on the surface 12a of the second semiconductor substrate 12. The second pad electrode 122 is electrically connected to devices and wirings, not illustrated, which are formed on or in the second semiconductor substrate 12. The first and second pad electrodes 121 may be, for example, a Cu electrode or the like.

The first passivation layer 131 is located on a circumferential edge portion (peripheral portion) of the first pad electrode 121 so as to cover the circumferential edge portion thereof. Similarly, the second passivation layer 132 is located on a circumferential edge portion of the second pad electrode 122 so as to cover the circumferential edge portion, i.e., they have a structure which surrounds the pad electrodes 121, 122 and overlie the outer portion thereof, such that the pad electrodes 121, 122 are not covered by the passivation layers 131, 132 at a location spaced inwardly of the edge thereof. The first and second passivation layers 131, 132 are, for example, a SiN film. The first and second passivation layers 131, 132 may further contain $SiO_2$ or a polyimide-resin.

The first base metal layer 141 is located on a center portion of the first pad electrode 121 and the first passivation layer 131 so as to cover the center portion and the first passivation layer 131. Similarly, the second base metal layer 142 is arranged on a center portion of the second pad electrode 122 and the second passivation layer 132, so as to cover the center portion and the second passivation layer 132.

Since the first passivation layer 131 is arranged on the circumferential edge portion of the first pad electrode 121, a circumferential edge portion (peripheral portion) of the first base metal layer 141 located on a upper layer of the first passivation layer 131 projects closer to the solder layer 163 than does the center portion of the first base metal layer 141, i.e., the center portion of the first base metal layer 141 is recessed. Similarly, since the second passivation layer 132 is arranged on the circumferential edge portion of the second pad electrode 122, a circumferential edge portion of the second base metal layer 142 located on a upper layer of the second passivation layer 132 projects closer to the solder layer 163 than does the center portion of the second base metal layer 142 i.e., the center portion of the second base metal layer 142 is recessed. The projected shapes of the circumferential edge portions of the base metal layers 141, 142 are reflected in the projected shapes of the circumferential edge portions 151a, 152a of barrier layers 151, 152 which will be described later.

The first and second base metal layers 141, 142 may be, for example, an Au layer.

The first barrier layer 151 is located on the first base metal layer 141 so as to cover the first base metal layer 141. The first barrier layer 151 prevents the diffusion of the solder layer 163 into the first base metal layer 141. The second barrier layer 152 is located on the second base metal layer 142 so as to cover the second base metal layer 142. The second barrier layer 152 prevents diffusion of the solder layer 163 into the second base metal layer 142. The first and second barrier layers 151, 152 may be, for example, a Ni layer.

The solder layer 163 may be made of, for example, a eutectic alloy containing low melting materials such as Sn, and Pb in the components thereof. Specifically, the solder layer 163 may be formed of SnAg, SnCu, SnPb, and the like.

The first alloy layer 161 comprises an alloy of the first barrier layer 151 and the solder layer 163. Specifically, the first alloy layer 161 is a layer formed by alloying a portion of the first barrier layer 151 and a portion of the solder layer 163, when the first barrier layer 151 (first semiconductor substrate 11) and the second barrier layer 152 (second semiconductor substrate 12) are bonded together by the solder layer 163. Similarly, the second alloy layer 162 comprises an alloy of the second barrier layer 152 and the solder layer 163. Specifically, the second alloy layer 162 is formed by alloying a portion of the second barrier layer 152 and a portion of the solder layer 163, when the first barrier layer 151 and the second barrier layer 152 are bonded together by the solder layer 163.

The material of the first alloy layer 161 and the material of the second alloy layer 162 may be identical to each other. For example, the first and second alloy layers 161, 162 may be an alloy layer of a material of the solder and Ni. In addition, when the materials of the first barrier layer 151 and the second barrier layer 152 are different from each, the material composition of the first alloy layer 161 and the second alloy layer 162 are different from each other.

The first barrier layer 151 projects closer to the solder layer 163 in the circumferential edge portion thereof (peripheral portion) 151a than in the center thereof. In other words, the first barrier layer 151 is recessed into the base metal 141 in the direction of the first semiconductor substrate in the center portion 151b thereof within the circumferential edge portion 151a thereof. In other words, the first barrier layer 151 has a recessed step shape recessed in the direction of the first semiconductor substrate 11 in the center portion 151b thereof.

The first barrier layer 151 is located on the first passivation layer 131, in the circumferential edge portion 151a and center portion 151b thereof. In other words, the circumferential edge portion 151a of the first barrier layer 151 covers the circumferential edge portion of the first base metal layer 141 which projects toward the solder layer 163. Since the circumferential edge portion 151a of the first barrier layer 151 covers the circumferential edge portion of the first base metal layer 141, even when the circumferential edge portion 151a of the first barrier layer 151 is not thicker than the center portion 151b, it projects toward the solder layer 163 from the center portion 151b thereof. Therefore, the projected shape of the circumferential edge portion 151a may be easily formed without requiring adjustment of the thickness of the first barrier layer 151.

The second barrier layer 152 projects toward the solder layer 163 in the circumferential edge portion (peripheral portion) 152a thereof. In other words, the center portion 152b of the second barrier layer located within the surrounding circumferential edge portion 152a is recessed in the direction of the second semiconductor substrate 12. In other words, the second barrier layer 152 has a recessed step shape extending toward the second semiconductor substrate 12 in the center portion 152b thereof.

The second barrier layer 152 is arranged over the second passivation layer 132 (below it in FIG. 1), in the circumferential edge portion 152a. In other words, the circumferential edge portion 152a of the second barrier layer 152 covers the circumferential edge portion of the second base metal layer 142 projecting to the solder layer 163. Since the circumferential edge portion 152a of the second barrier layer 152 covers the circumferential edge portion of the second base metal layer 142, even when the circumferential edge portion 152a is not thicker than the center portion 152b, it will project into the solder layer 163. Therefore, the projected shape of the circumferential edge portion 152a may be easily formed.

From the viewpoint of sufficiently securing the spacing interval of the solder layer 163, the distance d1 between the center portion 151b of the first barrier layer 151 and the center portion 152b of the second barrier layer 152 is preferably 8 μm or more. Further, from the viewpoint of suppressing the distance between the first semiconductor substrate 11 and the second semiconductor substrate 12 (in other words, the thickness of the semiconductor device 1), the distance d2 between the circumferential edge portion 151a of the first barrier layer 151 and the circumferential edge portion 152a of the second barrier layer 152 is preferably less than 8 μm.

When the bonding layer 16 includes only the alloy layers 161, 162, it is difficult to properly bond the first semiconductor substrate 11 and the second semiconductor substrate 12. This is because since the alloy layers 161, 162 include the solder layer 163 used for alloying with the barrier layers 151, 152, and voids or cracks occur at the time of alloying, electrical and mechanical connection functions are deteriorated. Further, if both surfaces of the barrier layers 151, 152 are flat, in order to secure the solder layer 163 of a sufficient thickness (amount) between the barrier layers 151, 152, it is necessary to widen the distance between barrier layers 151, 152. However, if the distance between the barrier layers 151, 152 is increased, it becomes difficult to minimize the thickness of the semiconductor device 1. Further, when the thickness of the solder layer 163 is increased, the solder layer 163 flows out from between the barrier layers 151, 152 and reaches another solder layer 163 nearby, and there is thus a high risk that adjacent pad electrodes 121 will be shorted to each other.

In contrast, in the present embodiment, it is possible to leave a portion of the solder layer 163 in the non-alloyed, intact, state between the first alloy layer 161 and the second alloy layer 162, such that the first semiconductor substrate 11 and the second semiconductor substrate 12 may be properly bonded together (electrically and mechanically connected). Further, in the present embodiment, since the center portions 151b, 152b of the barrier layers 151, 152 are recessed, even when the distance d2 between the circumferential edge portions 151a, 152a of the barrier layers 151, 152 is reduced, it is possible to stably maintain a solder layer 163 having a sufficient thickness required for proper mechanical and electrical properties between the facing center portions 151b, 152b of the barrier layers 151, 152.

Therefore, in the semiconductor device 1 according to the present embodiment, it is possible to reduce the thickness of the semiconductor device 1, and to properly bond the semiconductor substrates 11, 12 with each other.

FIG. 2 is a diagram illustrating a status in which voids V (see FIG. 1) may occur in the solder layer 163 depending on the depth d3 of the recess in central portions 151b, 152b of barrier layers 151, 152 in the first embodiment. In addition, "○" in FIG. 2 indicates that a void V does not occur in the solder layer 163. "Δ" in FIG. 2 indicates that voids V occur in a portion of the solder layer 163. "X" in FIG. 2 indicates that voids V occur in most of the solder layer 163. As illustrated in FIG. 2, if the depth d3 of the recessed portion is 4.0 μm, voids V occur in the portion of the solder layer 163 between the center portions 151b, 152b in some cases. Further, when the depth d3 is 4.2 μm or more, voids V occur in most of the solder layer 163 between the center portions 151b, 152b and cracks occur in some cases. In contrast, if the depth d3 is 3.5 μm or less, voids and cracks seldom occur. Therefore, from the viewpoint of suppressing voids and cracks, the depth d3 of the recess in the center portions 151b, 152b of the barrier layers 151, 152 is preferably 3.5 μm or less.

Figure 3A:
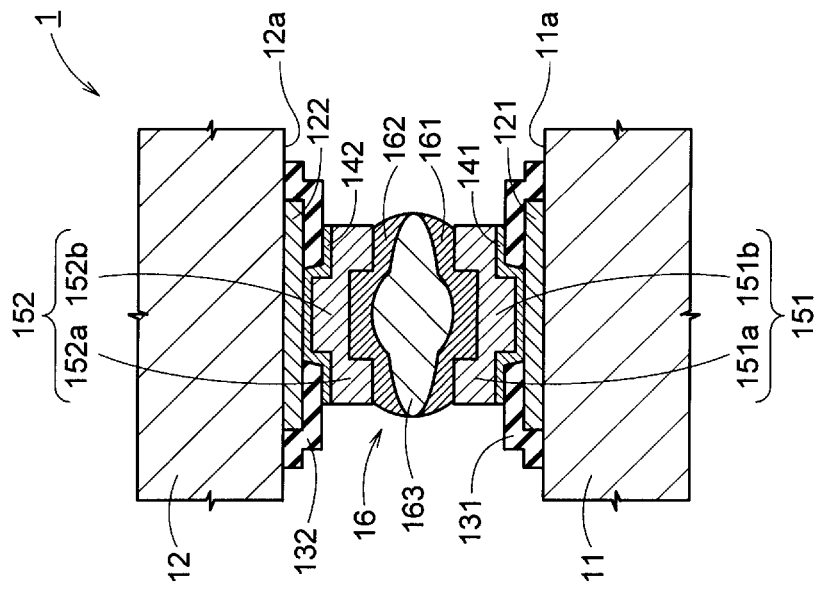
FIGS. 3A and 3B illustrate a manufacturing method of the semiconductor device in FIG. 1.
Figure 3B:
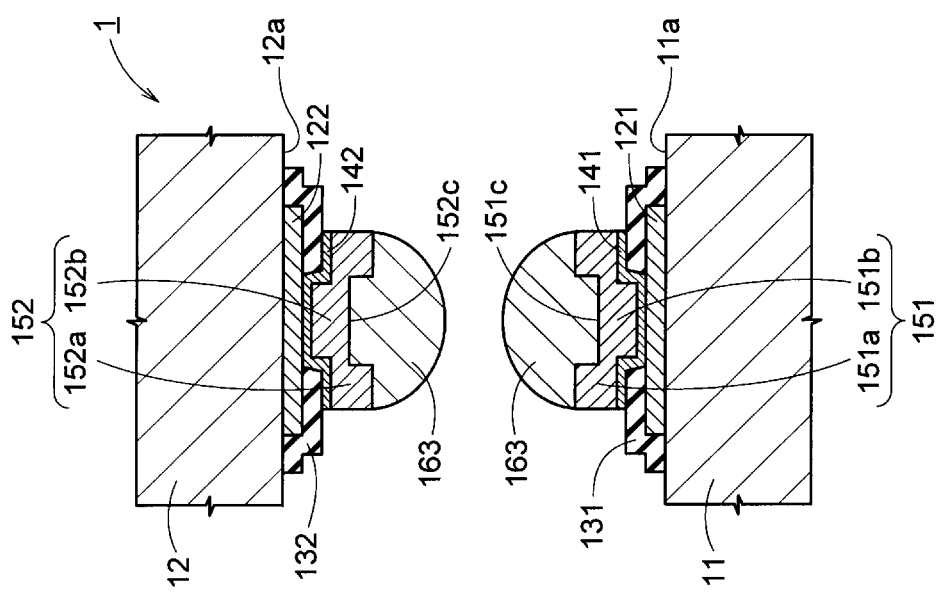

Next, a description will be given regarding a manufacturing method of the semiconductor device 1 having the above configuration. FIG. 3 is a schematic sectional view illustrating the manufacturing method of the semiconductor device 1 of FIG. 1. Specifically, FIG. 3A is a schematic sectional view illustrating the semiconductor substrates 11, 12 before bonding them together with the solder layer 163. FIG. 3B is a schematic sectional view illustrating the semiconductor substrates 11, 12 after bonding them together with the solder layer 163.

First, as illustrated in FIG. 3A, the semiconductor substrates 11, 12 in which the solder layers 163 formed on the surfaces 151c, 152c of the barrier layers 151, 152 are positioned in facing relationship in a reflow furnace, not illustrated. In addition, the solder layer 163 may be formed by, for example, an electrolytic plating process. The barrier layers 151, 152 and the solder layer 163 may configure a micro-bump.

Next, in a state in which the solder layers 163 formed on the barrier layers 151, 152 of the substrates 11, 12 are in contact with each other, the solder layers 163 are heated and melted (reflowed). Then, once the melted solder layer 163 is cooled and solidified, as illustrated in FIG. 3B, the semiconductor substrates 11, 12 are bonded together by the solder layer 163.

In this case, a portion of the first barrier layer 151 and the region of the solder layer 163 adjacent to the first barrier layer 151 are alloyed to form the first alloy layer 161. Further, a portion of the second barrier layer 152 and the region of the solder layer 163 adjacent to the second barrier layer 152 are alloyed to form the second alloy layer 162. Meanwhile, since the center portions 151b, 152b of the barrier layers 151, 152 are recessed, the thickness of the solder layer 163 remains relatively large between the center portions 151b, 152b. Since the thickness is large, even when a portion of the solder layer 163 between the center portions 151b, 152b is alloyed with the barrier layers 151, 152, a sufficient thickness of the remainder of the solder that is not alloyed may be maintained. Further, it is possible to prevent the solder layer 163 from flowing out to the side of the first barrier layer 151 and reaching the adjacent first pad electrode 121, because the thicker portion of the solder bond is in the corner. As a result, it is possible to prevent the first pad electrodes 121 nearby from being shorted to each other.

As described above, according to the manufacturing method of the semiconductor device 1 according to the first embodiment, the center portions 151b, 152b of the barrier layers 151, 152 are recessed (in other words, the circumferential edge portions 151a, 152a of the barrier layers 151, 152 project), thereby reducing the thickness of the semiconductor device 1 and properly bonding the semiconductor substrates 11, 12 together.

First Modification Example

Next, as a first modification example of the first embodiment, an example of the semiconductor device 1 having a flat surface of the second barrier layer 152 will be described. In addition, in the description of the first modification example, components corresponding to those in FIG. 1 are denoted by the same reference numerals and a repetitive description thereof will be omitted. FIG. 4 is a schematic sectional view illustrating a manufacturing method of the semiconductor device 1 illustrating the first modification example of the first embodiment. Specifically, FIG. 4A is a schematic sectional view illustrating the semiconductor substrates 11, 12 before bonding by the solder layer 163. FIG. 4B is a schematic sectional view illustrating the semiconductor substrates 11, 12 after bonding them together with the solder layer 163.

As illustrated in FIG. 4, the semiconductor device 1 according to the first modification example is different from the semiconductor device 1 in FIG. 1 in that the surface 152c of the second barrier layer 152 is flat (in other words, the circumferential edge portion thereof does not project outwardly with respect to the center portion thereof). Further, as illustrated in FIG. 4A, in the first modification example, before bonding the semiconductor substrates 11, 12, a metal layer 17 of Au or the like having a high electrical conductivity is provided on the surface 152c of the second barrier layer 152 instead of the solder layer 163.

In the first modification example, the center portion 151b of the first barrier layer 151 is recessed. Therefore, as illustrated in FIG. 4B, after bonding the semiconductor substrates 11, 12, it is possible to leave in place the portion solder layer 163 which is not alloyed with the center portions 151b, 152b of the barrier layers 151, 152 having a sufficient thickness to properly bond the substrates 11, 12 together, while also reducing the distance between the barrier layers 151, 152.

Therefore, also in the first modification example, it is possible to reduce the thickness of the semiconductor device 1, and to properly bond the semiconductor substrates 11, 12 to each other. Further, in the first modification example, since the solder layer 163 includes components of the metal layer 17 of high conductivity alloyed therewith, it is possible to improve the conductivity of the solder layer 163. Further, since the metal layer 17 has a small thickness in comparison with the solder layer 163, the additional suppression of the thickness of the semiconductor device 1 becomes possible.

Second Modification Example

Next, as a second modification example of the first embodiment, an example of the semiconductor device 1 including thick passivation layers 131, 132 formed therein will be described. In addition, in the description of the second modification example, components corresponding to those in FIG. 1 are denoted by the same reference numerals and a repetitive description thereof will be omitted. FIG. 5 is a schematic sectional view of the manufacturing method of the semiconductor device 1 illustrating the second modification example of the first embodiment. Specifically, FIG. 5A is a schematic sectional view of the manufacturing method of the semiconductor device 1 illustrating the semiconductor substrates 11, 12 before bonding them together using the solder layer 163. FIG. 5B is a schematic sectional view illustrating the semiconductor substrates 11, 12 after bonding them together with the solder layer 163.

As illustrated in FIG. 5, the second modification example is different from the semiconductor device 1 in FIG. 1 in that thicker passivation layers 131, 132 are formed than those of the first embodiment.

In the second modification example, the barrier layers 151, 152 are recessed in the center portions 151b, 152b. Therefore, as illustrated in FIG. 5B, after bonding the semiconductor substrates 11, 12 together, it is possible to reduce the distance between the barrier layers 151, 152 and to secure the solder layer 163, having a sufficient thickness hereof which is not alloyed with the center portions 151b, 152b of the barrier layers 151, 152. Therefore, also in the second modification example, it is possible to suppress the thickness of the semiconductor device 1, and to properly bond the semiconductor substrates 11, 12 to each other.

Third Modification Example

Figure 6A:
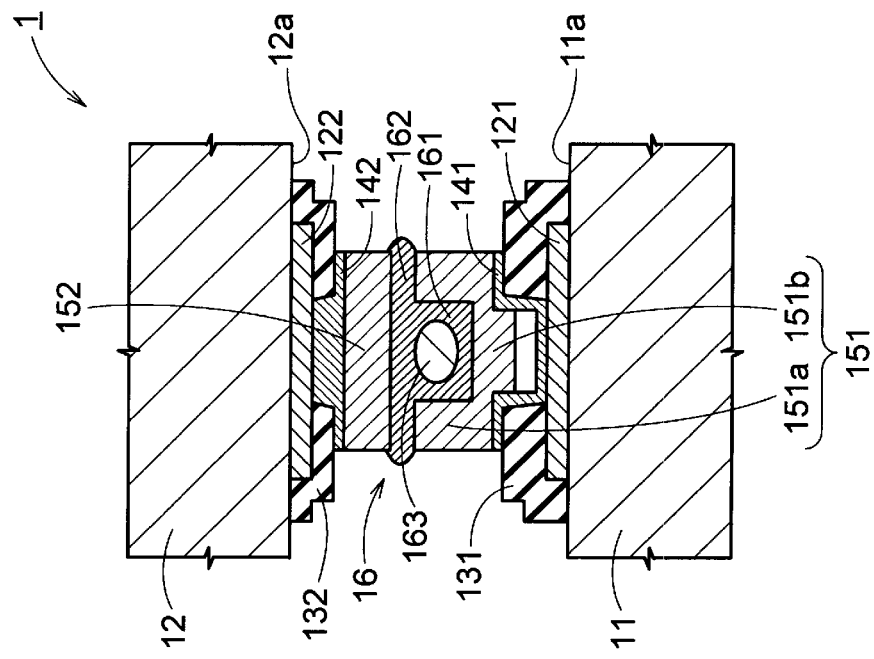
FIGS. 6A and 6B illustrate a manufacturing method of the semiconductor device according to a third modification example of the first embodiment.
Figure 6B:
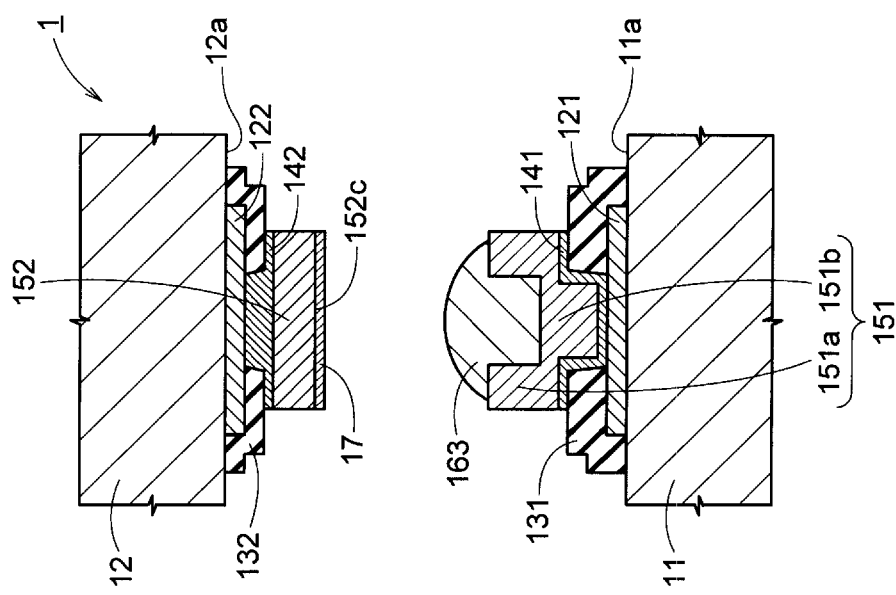

Next, as a third modification example of the first embodiment, an example of the semiconductor device 1 which is a combination of the first modification example and the second modification example will be described. In addition, in the description of the third modification example, components corresponding to those in FIG. 1 are denoted by the same reference numerals and a repetitive description thereof will be omitted. FIG. 6 is a schematic sectional view of the manufacturing method of the semiconductor device 1 illustrating the third modification example of the first embodiment. Specifically, FIG. 6A is a schematic sectional view illustrating the semiconductor substrates 11, 12 before bonding them together using with the solder layer 163. FIG. 6B is a schematic sectional view illustrating the semiconductor substrates 11, 12 after bonding them together with the solder layer 163.

As illustrated in FIG. 6B, the semiconductor device 1 according to the third modification example is different from the semiconductor device 1 in FIG. 1 in that the surface 152c of the second barrier layer 152 is flat and the passivation layers 131, 132 are thicker. Further, as illustrated in FIG. 6A, in the third modification example, before bonding together the semiconductor substrates 11, 12, a metal layer 17 of Au or the like having a high electrical conductivity is provided instead of the solder layer 163, on the surface 152c of the second barrier layer 152. In other words, the third modification example is a combination of the first modification example and the second modification example.

According to the third modification example, it is possible to achieve both effects of the first modification example and the second modification example.

Second Embodiment

Figure 7:
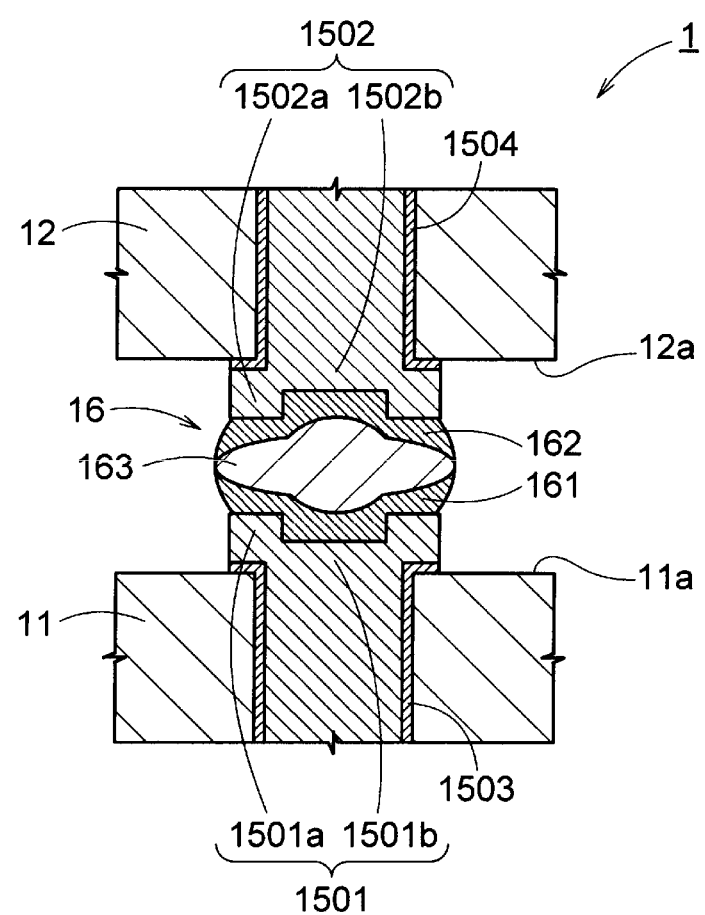
FIG. 7 is a schematic sectional view of the semiconductor device according to a second embodiment.

Next, as a second embodiment, an embodiment of the semiconductor device 1 including through electrodes will be described. In addition, in the description of the second embodiment, components corresponding to those of the first embodiment are denoted by the same reference numerals and a repetitive description thereof will be omitted. FIG. 7 is a schematic sectional view of the semiconductor device 1 illustrating a second embodiment.

As illustrated in FIG. 7, the semiconductor device 1 according to the second embodiment includes first and second through electrodes 1501, 1502 configured as first and second metal layers, instead of the barrier layers 151, 152. The first through electrode 1501 extends through the first semiconductor substrate 11. The second through electrode 1502 extends through the second semiconductor substrate 12. Barrier metal films 1503, 1504 are formed between the through electrodes 1501, 1502 and the semiconductor substrates 11, 12 along the sidewalls of the openings in the substrates 11, 12 through which the barrier metal films 1503, 1504 extend.

As illustrated in FIG. 7, the first through electrode 1501 projects into the solder layer 163 in the circumferential edge portion (peripheral portion) 1501*a* thereof. In other words, the first through electrode 1501 is recessed in the direction of the first semiconductor substrate 11 in the center portion 1501*b* thereof within the surrounding circumferential edge portion 1501*a*. Thus, the first through electrode 1501 has a recessed step shape recessed in the direction of the first semiconductor substrate 11, in the center portion 1501*b* thereof.

The second through electrode 1502 projects into the solder layer 163 at the circumferential edge portion (peripheral portion) 1502*a* thereof. In other words, the second through electrode 1502 is recessed into the second semiconductor substrate 12 at the center portion 1502*b* thereof within the surrounding circumferential edge portion 1502*a*. Thus, the second through electrode 1502 has a recessed step shape recessed in the direction of the second semiconductor substrate 12 in the center portion 1502*b* thereof.

According to the semiconductor device 1 according to the second embodiment, even when the distance between the circumferential edge portions 1501*a*, 1502*a* of the through electrodes 1501, 1502 is reduced, it is possible to maintain a solder layer 163 which is not alloyed with the material of the through electrodes having a sufficient thickness between the center portions 1501*b*, 1502*b* of the through electrodes 1501, 1502. Therefore, according to the second embodiment, in the three-dimensional mounting using the through electrodes 1501, 1502, it is possible to suppress the thickness of the semiconductor device 1, and to properly bond the semiconductor substrates 11, 12 with each other. In addition, in the second embodiment, one of the through electrodes 1501, 1502 may be changed to an electrode such as a pad electrode instead of a through electrode 1501, 1502.

Modification Example

Figure 8:
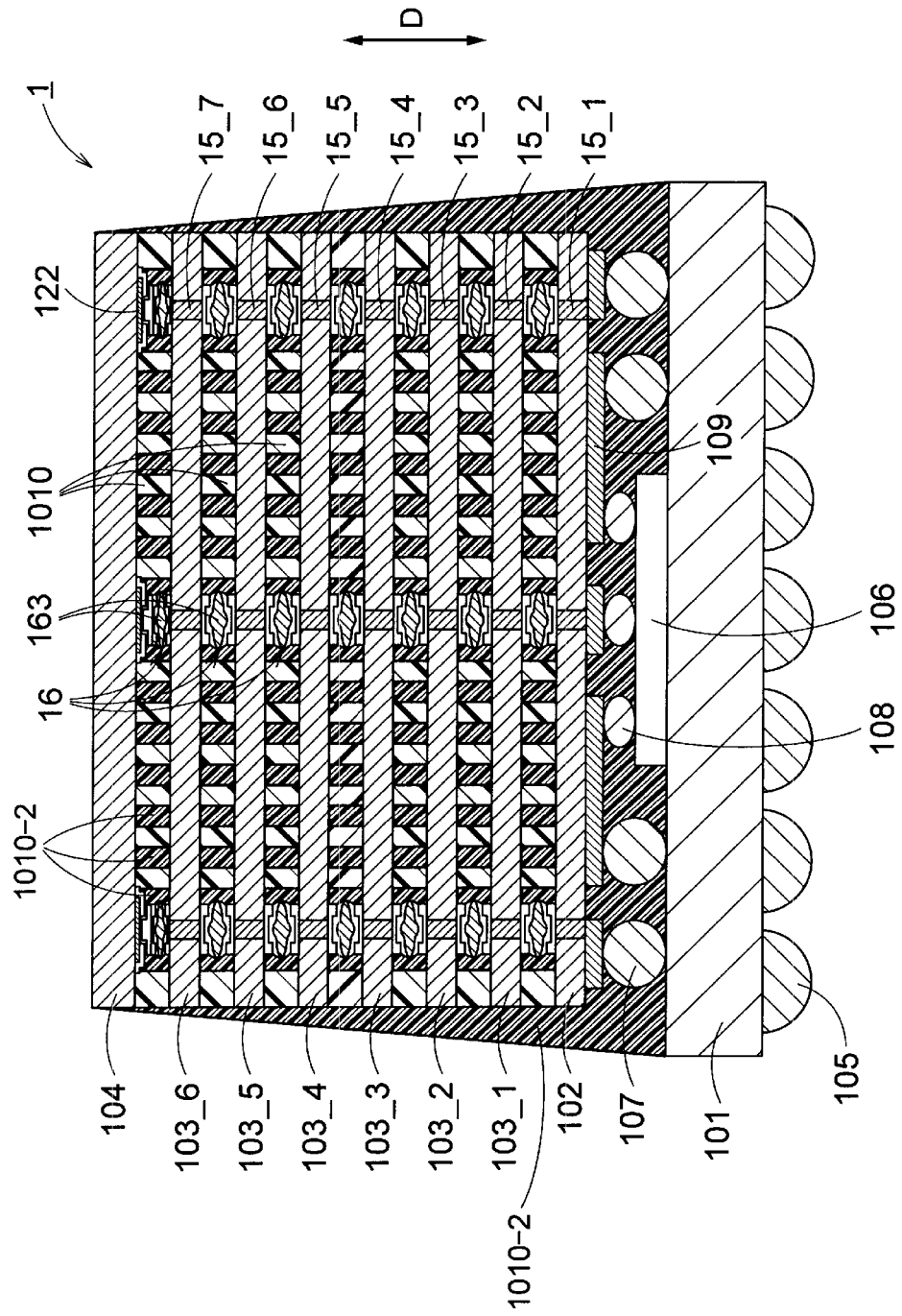
FIG. 8 is a schematic sectional view of the semiconductor device according to a modification example of the second embodiment.

Next, as a modification example of the second embodiment, an example of three-dimensional mounting using through-silicon via (TSV) will be described. In addition, in the description of the modification example, components corresponding to those in FIG. 7 are denoted by the same reference numerals and a repetitive description will be omitted. FIG. 8 is a schematic sectional view illustrating the semiconductor device 1 illustrating the modification example of the second embodiment.

As illustrated in FIG. 8, the semiconductor device 1 according to the modification example includes a ball grid array (BGA) substrate 101, and a plurality of (3 or more) layers of silicon chips 102, 103_1 to 103_6, and 104 (semiconductor substrates) which are mounted on (bonded to, connected to) the BGA substrate 101, through bumps 107, 108. The respective silicon chips 102, 103_1 to 103_6, 104 are stacked and arranged to have spacing in a thickness direction D extending from the semiconductor device 1. Wirings and semiconductor elements (devices), not illustrated, may be formed on and in the respective silicon chips 102, 103_1 to 6, 104.

An IC chip 106 is formed on the upper surface of the BGA substrate 101, and bumps 105 are formed on the lower surface of the BGA substrate 101.

The silicon chip 102 of the bottom layer (hereinafter, also referred to as a connection wiring chip) among the plurality layers of silicon chips includes a wiring layer 109 for connection with the BGA substrate 101 on the lower surface thereof. The wiring layer 109 is connected to the upper surface of the BGA substrate 101 through a first bump 107. Further, the wiring 109 is connected to an IC chip 106 formed on the upper surface of the BGA substrate 101 through a second bump 108. Further, the connection wiring chip 102 is penetrated by a TSV 15_1 extending therethrough.

A plurality of layers of silicon chips 103_1, 103_2, 103_3, 103_4, 103_5, 103_6 (hereinafter, also referred to as intermediate chips) which form the upper layers of the connection device ultimately connected to the wiring chip 102 are located (in the middle) between the silicon chip of the upper layer and the silicon chip of the lower layer. The intermediate chips 103_1 to 103_6 are respectively penetrated by TSVs 15_2 to 15_7 extending therethrough.

The silicon chip 104 of the top layer (hereinafter, also referred to as a base chip) does not include a TSV.

In the thickness direction D (vertical direction of FIG. 4), adjacent TSVs are bonded by the same bonding layer 16 structure as that shown in FIG. 7.

Among adjacent chips in the thickness direction D, the TSV of a chip on the lower side is an example of the first through electrode 1501 illustrated in FIG. 7. Meanwhile, the TSV of a chip thereover is an example of the second through electrode 1502. For example, the TSV 15_2 is the second through electrode 1502 for the TSV 15_1 of the lower chip, and the first through electrode 1501 for the TSV 15_3 of the upper, overlying, chip.

Further, the lower silicon chip is an example of the first semiconductor substrate 11, and the overlying upper silicon chip is an example of the second semiconductor substrate 12. In other words, the first semiconductor substrate 11 and the second semiconductor substrate 12 are any two adjacent semiconductor substrates among three or more semiconductor substrates (silicon chips 102, 101_1 to 6, 104). For example, silicon chip 103_1 is the first semiconductor substrate 12 overlying the silicon chip 102 and the underlying, first semiconductor substrate 11 for the overlying silicon chip 103_2.

Further, a resin 1010 is provided between adjacent silicon chips. Further, the resin 1010 and chip stack is surrounded by a sealing resin 1010-2.

Such a semiconductor device 1 may be mounted on and electrically connected to a circuit substrate, not illustrated, using bumps 105.

According to the semiconductor device 1 according to the present modification example, even when the distance between the circumferential edge portions of the adjacent TSV 15 is narrowed, it is possible to maintain a solder layer 163 having a sufficient thickness, which is not alloyed with an adjacent material, between the center portions of the TSV 15. Therefore, according to the modification example, in the three-dimensional mounting using the TSV, it is possible to suppress the thickness of the semiconductor device 1 and to properly connect the silicon chips.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

We claim:

1. A semiconductor device comprising:
a first semiconductor substrate;
a second semiconductor substrate facing the first semiconductor substrate;
a first pad electrode disposed on a surface of the first semiconductor substrate facing the second semiconductor substrate;
a second pad electrode disposed on a surface of the second semiconductor substrate facing the first semiconductor substrate;
a first insulating layer disposed on an edge portion of the first pad electrode and the first semiconductor substrate;
a second insulating layer disposed on an edge portion of the second pad electrode and the second semiconductor substrate;
a first metal layer disposed over the first pad electrode and facing the second semiconductor substrate;
a second metal layer disposed over the second pad electrode and facing the first semiconductor substrate;
a third metal layer disposed between the first metal layer and the second metal layer;
a first alloy layer disposed between the first metal layer and the third metal layer and comprising a component of the first metal layer and a component of the third metal layer; and
a second alloy layer disposed between the second metal layer and the third metal layer and comprising a component of the second metal layer and a component of the third metal layer,
wherein the first metal layer includes a first stepped surface adjacent to and in contact with the first alloy layer, the first stepped surface including a first central portion and first edge portions that extend beyond the first central portion, and
wherein the second metal layer includes a second stepped surface adjacent to and in contact with the second alloy layer, the second stepped surface including a second central portion and second edge portions that extend beyond the second central portion.

2. The device according to claim 1, further comprising:
a first base metal layer disposed between the first pad electrode and the first metal layer.

3. The device according to claim 2, further comprising:
a second base metal layer disposed between the second pad electrode and the second metal layer.

4. The device according to claim 1, wherein the third metal layer comprises solder.

5. The device according to claim 1, wherein at least one of the first and second metal layers comprises Ni.

6. The device according to claim 1, wherein at least one of the first and second metal layers comprises Au.

7. The device according to claim 1, further comprising:
a third semiconductor substrate facing the first semiconductor substrate or the second semiconductor substrate.

8. The device according to claim 1, wherein the depth of each of the first and the second stepped surface is less than or equal to 3.5 µm.

9. A semiconductor device comprising a first substrate overlying, and physically and electrically connected to a second substrate, the semiconductor device comprising:
a first metal layer on the first substrate;
a second metal layer on the second substrate; and
an interconnection portion physically and electrically connecting the first metal layer and the second metal layer, the interconnection portion comprising:
at least one third metal layer, and
an alloy of at least one of the first or the second metal layer and the third metal layer,
wherein the first metal layer includes a first recessed portion extending inwardly therein, the second metal layer includes a second recessed portion extending inwardly therein, and the thickness of the third metal layer is greater in the space between the first recessed portion and the second recessed portion than in the space between a non-recessed portion of the first metal layer and a non-recessed portion of the second metal layer.

10. The semiconductor device of claim 9, wherein the first and second metal layers comprise Ni.

11. The semiconductor device of claim 9, wherein at least one of the first and second metal layers comprises Au.

12. The semiconductor device of claim 9, wherein the first recessed portion and the second recessed portion are no deeper than 3.5 µm.

13. The semiconductor device of claim 9, wherein at least one of the first metal layer and the second metal layer comprises a through-silicon via.

14. The semiconductor device of claim 9, further comprising:
a first pad electrode disposed on the first substrate; and
a first base metal layer disposed between the first pad electrode and the first metal layer.

15. The semiconductor device of claim 14, further comprising:
a second pad electrode disposed on the second substrate; and
a second base metal layer disposed between the second pad electrode and the second metal layer.

16. A method of forming a semiconductor device, comprising:
positioning a first semiconductor substrate, the first semiconductor substrate comprising:
first pad electrode disposed on a surface of the first semiconductor substrate facing a second semiconductor substrate;
a first insulating layer disposed on an edge portion of the first pad electrode and the first semiconductor substrate;
a first metal layer disposed over the first semiconductor substrate and facing the second semiconductor substrate, the first metal layer including a first stepped surface having a first central portion and first edge portions that extend beyond the first central portion; and
a first solder layer disposed on the first stepped surface of the first metal layer;
positioning the second semiconductor substrate adjacent to and facing the first semiconductor substrate, the second semiconductor substrate comprising:
a second pad electrode disposed on a surface of the second semiconductor substrate facing the first semiconductor substrate;
a second insulating layer disposed on an edge portion of the second pad electrode and the second semiconductor substrate;
a second metal layer disposed over the second semiconductor substrate and facing the first semiconductor substrate, the second metal layer including a second stepped surface having a second central portion and second edge portions that extend beyond the second central portion; and
a second solder layer disposed on the second stepped surface of the second metal layer; and bonding the first semiconductor substrate to the second semiconductor substrate, wherein the bonding further comprises:
  forming a first alloy layer between the first metal layer and the first solder layer; and
  forming a second alloy layer between the second metal layer and the second solder layer, and wherein at least a portion of the first solder layer and the second solder layer remains between the first alloy layer and the second alloy layer after bonding.

17. The method of claim 16, wherein at least one of the first solder layer and the second solder layer comprises a tin (Sn) based solder.

18. The method of claim 16, wherein the depth of each of the first stepped surface and the second stepped surface is less than or equal to 3.5 µm.

\* \* \* \* \*